US009615455B2

(12) United States Patent
Kawato et al.

(10) Patent No.: US 9,615,455 B2
(45) Date of Patent: *Apr. 4, 2017

(54) COPPER PARTICULATE DISPERSION, CONDUCTIVE FILM FORMING METHOD AND CIRCUIT BOARD

(75) Inventors: Yuichi Kawato, Hyogo (JP); Yusuke Maeda, Hyogo (JP); Tomio Kudo, Hyogo (JP)

(73) Assignees: ISHIHARA CHEMICAL CO., LTD., Hyogo (JP); APPLIED NANOTECH HOLDINGS, INC., Austin, TX (US)

( * ) Notice: Subject to any disclaimer, the term of this patent is extended or adjusted under 35 U.S.C. 154(b) by 387 days.

This patent is subject to a terminal disclaimer.

(21) Appl. No.: 14/346,519

(22) PCT Filed: Jan. 4, 2012

(86) PCT No.: PCT/JP2012/050009
§ 371 (c)(1),
(2), (4) Date: Mar. 21, 2014

(87) PCT Pub. No.: WO2013/073199
PCT Pub. Date: May 23, 2013

(65) Prior Publication Data
US 2014/0370310 A1     Dec. 18, 2014

(30) Foreign Application Priority Data
Nov. 14, 2011  (JP) ................. 2011-248126

(51) Int. Cl.
| H05K 3/00 | (2006.01) |
| C09D 11/52 | (2014.01) |
| H01B 1/22 | (2006.01) |
| H05K 1/09 | (2006.01) |
| H01B 1/02 | (2006.01) |
| H01L 23/498 | (2006.01) |
| H05K 3/12 | (2006.01) |

(52) U.S. Cl.
CPC ............. *H05K 1/097* (2013.01); *C09D 11/52* (2013.01); *H01B 1/026* (2013.01); *H01B 1/22* (2013.01); *H01L 23/49883* (2013.01); *H05K 3/00* (2013.01); *H01L 2924/0002* (2013.01); *H05K 3/1283* (2013.01); *H05K 2203/107* (2013.01); *Y10T 428/31678* (2015.04)

(58) Field of Classification Search
None
See application file for complete search history.

(56) References Cited

U.S. PATENT DOCUMENTS

| 9,120,944 B2* | 9/2015 | Kawato ............... H01B 1/026 |
| 2004/0009294 A1 | 1/2004 | Kuribayashi et al. |
| 2006/0070493 A1 | 4/2006 | Hirakoso et al. |
| 2007/0244220 A1 | 10/2007 | Kim et al. |
| 2008/0072706 A1 | 3/2008 | Lee et al. |
| 2008/0286488 A1 | 11/2008 | Li et al. |
| 2009/0029065 A1 | 1/2009 | Terada et al. |
| 2009/0151998 A1 | 6/2009 | Fujiwara et al. |
| 2009/0242854 A1 | 10/2009 | Li et al. |
| 2009/0261304 A1 | 10/2009 | Mori et al. |
| 2011/0155432 A1 | 6/2011 | Tomonari et al. |
| 2014/0216798 A1 | 8/2014 | Kawato et al. |

FOREIGN PATENT DOCUMENTS

| CN | 101232963 A | 7/2008 |
| CN | 101990687 A | 3/2011 |
| CN | 102137728 A | 7/2011 |
| EP | 2319643 A1 | 5/2001 |
| JP | 2004-043776 A | 2/2004 |
| JP | 2004-185952 A | 7/2004 |
| JP | 2008-088518 A | 4/2008 |
| JP | 2009-105040 A | 5/2009 |
| JP | 2009-135480 A | 6/2009 |
| JP | 2011-47021 A | 3/2011 |
| TW | 201333972 A1 | 8/2013 |
| WO | 2004/110925 A | 12/2004 |
| WO | 2009/111393 A2 | 9/2009 |
| WO | 2010/114769 A1 | 10/2010 |

OTHER PUBLICATIONS

Chinese Office Action issued with respect to application No. 201280054216.5, mail date is Aug. 4, 2015.
Notification of Examination Opinions issued with respect to Taiwanese Patent Application No. 101142298, issued in Taiwan on Jun. 26, 2014.
Amendment and Response to the Examination Opinions, mail date is Sep. 24, 2014.
Taiwanese Office Action issued with respect to Taiwanese Patent Application No. 101142298, mail date is Jun. 1, 2013.
Korean Office Action issued with respect to application No. 2014-7009075, mail date is May 18, 2015.
Extended European search report issued with respect to Application No. 12849326.9, mail date is Apr. 9, 2015.
Partial supplementary European search report issued with respect to European Patent Application No. 12849326.9, mail date is Jan. 12, 2015.
Search Report issued with respect to International Application No. PCT/JP2012/050009, mail date is Apr. 3, 2012.
U.S. Appl. No. 14/346,534, filed Mar. 21, 2014.
U.S. Appl. No. 14/346,544, filed Mar. 21, 2014.

* cited by examiner

*Primary Examiner* — Sheeba Ahmed
(74) *Attorney, Agent, or Firm* — Greenblum & Bernstein, P.L.C.

(57) ABSTRACT

The copper particulate dispersion includes copper particulates, at least one kind of a dispersion vehicle containing the copper particulates, and at least one kind of dispersant which allows the copper particulates to disperse in the dispersion vehicle. The copper particulates have a center particle diameter of 1 nm or more and less than 100 nm. The dispersion vehicle is a polar dispersion vehicle. The dispersant is a compound having at least one acidic functional group, which has a molecular weight of 200 or more and 100,000 or less, or a salt thereof. Whereby, the dispersant has compatibility with dispersion vehicle and a surface of copper particulates is coated with dispersant molecules, and thus the copper particulates are dispersed in the dispersion vehicle.

8 Claims, No Drawings

COPPER PARTICULATE DISPERSION, CONDUCTIVE FILM FORMING METHOD AND CIRCUIT BOARD

TECHNICAL FIELD

The present invention relates to a copper particulate dispersion, a conductive film forming method using the copper particulate dispersion, and a circuit board manufactured by using the conductive film forming method.

BACKGROUND ART

There has hitherto existed a printed board in which a circuit composed of a copper foil is formed on a substrate by photolithography. Photolithography includes the step of etching a copper foil and high costs are required for a treatment of waste fluid generated by etching.

There has been known, as the technology requiring no etching, a method in which a conductive film is formed on a substrate using a copper particulate dispersion (copper ink) containing copper particulates (copper nanoparticles) dispersed in a dispersion vehicle (see, for example, Patent Literature 1). According to this method, a film of the copper particulate dispersion is formed on the substrate and, after drying the film, copper particulates in the film are melted by exposure to light and thus conductivity is imparted to the film.

In such a copper particulate dispersion, there have been known some specific examples of the formulation in which copper particulates are dispersed. However, there has never been known general formulation in which copper particulates are dispersed.

During storage before use of the copper particulate dispersion, copper particulates in a dispersion vehicle may be sometimes aggregated to form a precipitate (caking) with the lapse of time, and thus it has been required to improve dispersion stability.

CITATION LIST

Patent Literature

Patent Literature 1: U.S. Patent Application No. 2008/0286488

SUMMARY OF INVENTION

Technical Problem

The present invention is made so as to solve the above-mentioned problems and an object thereof is to provide a formulation of a copper particulate dispersion in which copper particulates are dispersed.

Solution to Problem

The copper particulate dispersion of the present invention includes copper particulates, at least one kind of a dispersion vehicle containing the copper particulates, and at least one kind of dispersant which allows the copper particulates to disperse in the dispersion vehicle, wherein the copper particulates have a center particle diameter of 1 nm or more and less than 100 nm, the dispersion vehicle is a polar dispersion vehicle, and the dispersant is a compound having at least one acidic functional group, which has a molecular weight of 200 or more and 100,000 or less, or a salt thereof.

In this copper particulate dispersion, the polar dispersion vehicle preferably contains at least one of a protic dispersion vehicle and an aprotic polar dispersion vehicle having a dielectric constant of 30 or more.

In this copper particulate dispersion, the protic dispersion vehicle is preferably a linear or branched alkyl compound or alkenyl compound of 5 or more and 30 or less carbon atoms, which has one hydroxyl group.

In this copper particulate dispersion, the protic dispersion vehicle may be a linear or branched alkyl compound or alkenyl compound of 2 or more and 30 or less carbon atoms, which has 2 or more and 6 or less hydroxyl groups.

In this copper particulate dispersion, the protic dispersion vehicle may have 1 or more and 10 or less ether bonds.

In this copper particulate dispersion, the protic dispersion vehicle may have 1 or more and 5 or less carbonyl groups.

In this copper particulate dispersion, the aprotic polar dispersion vehicle is preferably selected from the group consisting of propylene carbonate, 1,3-dimethyl-2-imidazolidinone, N,N-dimethylacetamide, N,N-dimethylformamide, N-methyl pyrrolidone and γ-butyrolactone.

In this copper particulate dispersion, the acidic functional group of the dispersant is preferably selected from the group consisting of a phosphoric acid group, a phosphoric acid group, a sulfonic acid group, a sulfuric acid group and a carboxyl group.

The conductive film forming method of the present invention includes the steps of forming a film made of the copper particulate dispersion on a surface of an object, drying the film thus formed, and forming a conductive film through photo sintering of irradiating the dried film with light.

The circuit board of the present invention includes a circuit including the conductive film formed by the conductive film forming method on a substrate.

Advantageous Effects of Invention

According to the copper particulate dispersion of the present invention, since the dispersant has an acidic functional group and the dispersion vehicle is a polar dispersion vehicle, the dispersant has compatibility with the dispersion vehicle. Since a surface of copper particulates is coated with dispersant molecules, the copper particulates are dispersed in the dispersion vehicle.

DESCRIPTION OF EMBODIMENTS

The copper particulate dispersion according to the embodiment of the present invention will be described. The copper particulate dispersion includes copper particulates, at least one kind of a dispersion vehicle containing the copper particulates, and at least one kind of a dispersant. The dispersant allows the copper particulates to disperse in a dispersion vehicle. In the present embodiment, the copper particulates are particles of copper, which have a center particle diameter of 1 nm or more and less than 100 nm. A polar dispersion vehicle is used as the dispersion vehicle. The polar dispersion vehicle is protic, or when it is aprotic, a dielectric constant is 30 or more. The dispersant is a compound having a molecular weight of 200 or more and 100,000 or less, or a salt thereof, and it has at least one acidic functional group.

The copper particulates are particles of copper, which have a center particle diameter of 1 nm or more and less than 100 nm, and copper particulates having the same center particle diameter may be used alone, or copper particulates having two or more kinds of center particle diameters may be used in combination. When the center particle diameter is 100 nm or more, the weight of particles increases, resulting in poor dispersion stability.

The concentration of copper particulates is 1% by weight or more and 80% by weight or less based on the copper particulate dispersion. When the concentration of copper particulates is less than 1% by weight, it is impossible to obtain copper particulates in the amount enough to form a conductive film. In contrast, when the concentration is more than 80% by weight, dispersion stability is poor due to too large amount of copper particulates.

This protic dispersion vehicle is a linear or branched alkyl compound or alkenyl compound of 5 or more and 30 or less carbon atoms, which has one hydroxyl group. This protic dispersion vehicle may have 1 or more and 10 or less ether bonds, and may have 1 or more and 5 or less carbonyl groups. In case of having 4 or less carbon atoms, polarity of the dispersion vehicle increases and thus the dispersion effect of copper particulates is obtained. However, elution (corrosion) of copper particulates into the dispersion vehicle occurs, resulting in poor dispersion stability. In case of having more than 30 carbon atoms, polarity of the dispersion vehicle decreases and thus it becomes impossible to dissolve a dispersant.

Examples of such a protic dispersion vehicle include, but are not limited to, 3-methoxy-3-methyl butanol, triethylene glycol monomethyl ether, diethylene glycol monobutyl ether, diethylene glycol monomethyl ether, propylene glycol monobutyl ether, ethylene glycol monohexyl ether, ethylene glycol mono-tert-butyl ether, 2-octanol and the like.

The protic dispersion vehicle may be a linear or branched alkyl compound or alkenyl compound of 2 or more and 30 or less carbon atoms, which has 2 or more and 6 or less hydroxyl groups. This protic dispersion vehicle may have 1 or more and 10 or less ether bonds, and may have 1 or more and 5 or less carbonyl groups.

Examples of such a protic dispersion vehicle include, but are not limited to, 2-methylpentane-2,4-diol, ethylene glycol, propylene glycol, 1,5-pentanediol, diethylene glycol, triethylene glycol, glycerin, sorbitol and the like.

Examples of the aprotic polar dispersion vehicle having a dielectric constant of 30 or more include, but are not limited to, propylene carbonate, 1,3-dimethyl-2-imidazolidinone, hexamethylphosphoramide, N-methyl pyrrolidone, N-ethyl pyrrolidone, nitrobenzene, N, N-diethylformamide, N, N-dimethylacetamide, furfural, γ-butyrolactone, ethylene sulfite, sulfolane, dimethyl sulfoxide, succinonitrile, ethylene carbonate and the like.

These polar dispersion vehicle may be used alone, or two or more kinds of them may be appropriately used in combination.

This dispersant is a compound having at least one or more acidic functional group, which has a molecular weight of 200 or more and 100,000 or less, or a salt thereof. The acidic functional group of the dispersant is a functional group having acidity, namely, proton donor ability and includes, for example, a phosphoric acid group, a phosphonic acid group, a sulfonic acid group, a sulfuric acid group and a carboxyl group.

In case of using these dispersants, they may be used alone, or two or more kinds of them may be appropriately used in combination. The concentration of the dispersant is 0.5% by weight or more and 50% by weight or less based on the copper particulate dispersion. When the concentration of the dispersant is less than 0.5% by weight, sufficient dispersion effect cannot be obtained. In contrast, when the concentration is more than 50% by weight, in case of using the copper particulate dispersion in a printing method, it exerts an adverse influence on printing characteristics.

It is possible to appropriately add a leveling agent, a surface modifier, a defoamer, a corrosion prevention agent, a resin component, a photo sintering modifier and the like to these copper particulate dispersions according to intended uses as long as dispersion stability is not impaired.

In the copper particulate dispersion formulated as mentioned above, since the dispersant has an acidic functional group and the dispersion vehicle is a polar dispersion vehicle, the dispersant has compatibility with the dispersion vehicle.

Furthermore, when the dispersion vehicle is a protic dispersion vehicle, since the dispersion vehicle has proton donor ability, a hydrogen bond is formed between dispersion vehicle molecules and interacts with an acidic functional group of the dispersant. When the dispersion vehicle is an aprotic polar dispersion vehicle, since the dispersion vehicle has no proton donor ability but has a high dielectric constant such as 30 or more, an acidic functional group of the dispersant can cause dissociation of proton ($H^+$).

Since a surface of copper particulates is coated with dispersant molecules, the copper particulates are dispersed in the dispersion vehicle by an electrostatic interaction between the dispersant and dispersion vehicle. Because of small particle diameter, aggregation of copper particulates is prevented when an electrostatic interaction is large between the dispersant and dispersion vehicle. If aggregation does not occur, sedimentation does not occur and thus dispersion stability of the copper particulate dispersion increases.

When the protic dispersion vehicle has an ether bond or a carbonyl group, since polarity increases, compatibility with the dispersant increases, resulting in high dispersion stability of the copper particulate dispersion.

The inventors of the present invention have found such formulation of the copper particulate dispersion by performing numerous experiments. It is considered that high dispersion stability of this copper particulate dispersion is almost achieved by the following action. Since an outermost surface of copper particulates is oxidized by oxygen contained in atmospheric air, a thin surface oxide film made of copper oxide is formed. In the present embodiment, dispersion vehicle molecules have polarity. The copper particulates coated with the thin surface oxide film are scarcely dissolved in a polar solvent. On the other hand, a dispersant having an acidic functional group has compatibility with a polar dispersion vehicle since molecules have polarity. When the polar dispersion vehicle includes a protic dispersion vehicle or an aprotic polar dispersion vehicle having a dielectric constant of 30 or more, the compatibility with the dispersant increases because of large polarity. When the dispersant is dissolved in the dispersion vehicle, the acidic functional group of the dispersant causes dissociation of proton ($H^+$). Proton thus dissociated is added to copper oxide of a surface oxide film as a result of withdrawing by an oxygen atom having large electronegativity. The copper particulates are positively charged by the addition of protons to copper oxide. Since the acidic functional group, which caused dissociation of proton, is negatively charged, it is adsorbed on a surface of copper particulates by an electrostatic interaction to form an adsorption layer made of dispersant molecules. The copper particulates are coated with this adsorption layer and dispersed in the dispersion vehicle.

In the dispersion vehicle, each of positively charged copper particulates and negatively charged adsorption layer form an electric double layer. When copper particulates approach each other, potential energy of an interaction between particulates including an electric double layer increases, resulting in formation of a repulsive force. Since the dispersant is a compound having a molecular weight of 200 or more and 100,000 or less, copper particulates coated with dispersant molecules mutually form a repulsive force caused by the action of steric stabilization of dispersant molecules. Aggregation of copper particulates is prevented by the repulsive force attributing to such an electric double layer and steric stabilization.

Since copper particulates have a center particle diameter of 1 nm or more and less than 100 nm, the effect of Brownian motion becomes larger than a sedimentation rate represented by Stokes' law when the copper particulates are not aggregated, and thus sedimentation does not occur. Since copper particulates do not undergo sedimentation, copper particulates are not precipitated in the copper particulate dispersion, resulting in high dispersion stability.

The above-mentioned action is one theory for explaining the experimental results, and the copper particulate dispersion is not limited thereto.

The conductive film forming method using a copper particulate dispersion of the present embodiment will be described. First, a film made of a copper particulate dispersion is formed on a surface of an object. The object is, for example, a substrate made of polyimide or glass. The film made of the copper particulate dispersion is formed, for example, by a printing method. In the printing method, the copper particulate dispersion is used as a printing ink, and a predetermined pattern is printed on the object by a printing device to form a film with the pattern. A solid film made of the copper particulate dispersion may be formed by spin coating or the like.

Next, the film made of the copper particulate dispersion is dried. The dispersion vehicle and the dispersant in the copper particulate dispersion are vaporized by drying the film, and thus copper particulates remain. The drying time of the film varies depending on the dispersion vehicle, and drying is completed within 30 minutes under an air atmosphere at 100° C.

Next, the dried film is irradiated with light. Copper particulates are fired by irradiation with light. In firing (photo sintering) by irradiation with light, reduction of a surface oxide film of copper particulates and sintering of copper particulates occur. The copper particulates are mutually melted in sintering and welded to the substrate. Photo sintering is performed at room temperature under atmospheric air. A light source used in photo sintering is, for example, a xenon lamp. A laser equipment may be used as a light source. Magnitude of energy of light irradiated from the light source is within a range of 0.1 $J/cm^2$ or more and 100 $J/cm^2$ or less. The irradiation time is 0.1 ms or more and 100 ms or less. Irradiation may be performed once or plural times (multistage irradiation). Conductivity is imparted to the film subjected to photo sintering. Whereby, a conductive film is formed. The thus formed conductive film is in the form of a continuous film. Resistivity of the conductive film is from 2 $\mu\Omega \cdot cm$ to 9 $\mu\Omega \cdot cm$.

The circuit board produced by using this conductive film forming method will be described. This circuit board includes a circuit on a substrate. The substrate is obtained by forming an insulating material such as polyimide or glass into a plate and is, for example, a flexible substrate or a rigid substrate. The substrate may be composed of a semiconductor such as a silicone wafer. The circuit includes a conductive film formed by this conductive film forming method. The conductive film constitutes, for example, a conducting wire which electrically connects between circuit elements. The conductive film may constitute the circuit element or a part thereof, for example, a coil, an electrode of a capacitor and the like.

A copper particulate dispersion as Example of the present invention, and a copper particulate dispersion for comparison were prepared. The copper particulate dispersion was prepared by the following method, and then evaluated. After weighing a predetermined concentration, copper particulates were gradually added to a dispersant and dispersion vehicle compatibilized mutually, followed by mixing and stabilization at a given temperature for a given time using a disperser. Dispersibility of the thus prepared copper particulate dispersion was confirmed by the fact that no precipitate is formed, and coarse particles are absent on a film after printing by the below-mentioned drawdown method. Dispersion stability was confirmed by the fact that no precipitate is formed after storage of the copper particulate dispersion at 5° C. for one month.

The conductive film formed from the copper particulate dispersion was evaluated by the following method. The copper particulate dispersion was printed on a polyimide substrate in a film thickness of about 0.5 μm by the drawdown method, dried under an atmospheric air atmosphere at 100° C. for 15 minutes, and then subjected to photo sintering by a flash irradiation device using a xenon lamp. Photo sintering was carried out at magnitude of energy within a range from 0.5 to 30 $J/cm^2$ for 0.1 ms to 10 ms until a conductive film having optimum resistivity is obtained by irradiation with light once or plural times.

Example 1

Using copper particulates having a center particle diameter of 20 nm, 3-methoxy-3-methyl butanol (with proticity) as a dispersion vehicle, and a compound having a phosphoric acid group, which has a molecular weight of about 1,500 (manufactured by BYK-Chemie under the trade name of "DISPERBYK (registered trademark)-111") as a dispersant, a copper particulate dispersion was prepared. The concentration of the dispersant was adjusted to 3.6% by weight and the concentration of copper particulates was adjusted to 40% by weight. The concentration of the dispersion vehicle is balance thereof. The copper particulates were dispersed. This copper particulate dispersion was stored at 5° C. for one month. As a result, no change occurred and thus it was confirmed to have high dispersion stability.

Example 2

Using copper particulates having a center particle diameter of 40 nm, 3-methoxy-3-methyl butanol (with proticity) as a dispersion vehicle, and a compound having a phosphoric acid group, which has a molecular weight of about 1,500 (manufactured by BYK-Chemie under the trade name of "DISPERBYK (registered trademark)-111") as a dispersant, a copper particulate dispersion was prepared. The concentration of the dispersant was adjusted to 1.8% by weight and the concentration of copper particulates was adjusted to 40% by weight. The concentration of the dispersion vehicle is balance thereof. The copper particulates were dispersed. This copper particulate dispersion was stored at 5° C. for one month. As a result, no change occurred and thus it was confirmed to have high dispersion stability.

Example 3

Using copper particulates having a center particle diameter of 70 nm, 3-methoxy-3-methyl butanol (with proticity) as a dispersion vehicle, and a compound having a phosphoric acid group, which has a molecular weight of about 1,500 (manufactured by BYK-Chemie under the trade name of "DISPERBYK (registered trademark)-111") as a dispersant, a copper particulate dispersion was prepared. The concentration of the dispersant was adjusted to 5% by weight and the concentration of copper particulates was adjusted to 70% by weight. The concentration of the dispersion vehicle is balance thereof. The copper particulates were dispersed. This copper particulate dispersion was stored at 5° C. for one month. As a result, no change occurred and thus it was confirmed to have high dispersion stability.

Example 4

In the same manner as in Example 3, except that the concentration of the dispersant was changed to 0.9% by weight and the concentration of copper particulates was changed to 45% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 $\mu\Omega\cdot cm$, and a desired value was obtained.

Example 5

In the same manner as in Example 4, except that the concentration of the dispersant was increased, three kinds of copper particulate dispersions were prepared. The concentration of the dispersant was adjusted to 1.8% by weight, 9% by weight and 18% by weight. In each case, the copper particulates were dispersed. These copper particulate dispersions were stored at 5° C. for one month. As a result, no change occurred. Conductive films formed by photo sintering using these copper particulate dispersion had resistivities of 5 $\mu\Omega\cdot cm$, 6 $\mu\Omega\cdot cm$ and 6 $\mu\Omega\cdot cm$, respectively.

Example 6

In the same manner as in Example 4, except that the concentration of copper particulates was changed to 20% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 6 $\mu\Omega\cdot cm$.

Example 7

In the same manner as in Example 4, except that the dispersant was changed to a compound having a phosphoric acid group, which has a molecular weight of several tens of thousands (manufactured by BYK-Chemie under the trade name of "DISPERBYK (registered trademark)-2001") and the concentration thereof was changed to 3.6% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 5 $\mu\Omega\cdot cm$.

Example 8

In the same manner as in Example 7, except that the concentration of the dispersant was increased, two kinds of copper particulate dispersions were prepared. The concentration of the dispersant was adjusted to 7.2% by weigh and 18% by weight. In each case, the copper particulates were dispersed. These copper particulate dispersions were stored at 5° C. for one month. As a result, no change occurred. Conductive films formed by photo sintering using these copper particulate dispersion had resistivities of 5 $\mu\Omega\cdot cm$ and 4 $\mu\Omega\cdot cm$, respectively.

Example 9

In the same manner as in Example 4, except that the dispersant was changed to a polyoxyethylene lauryl ether phosphoric acid ester (molecular weight: 200 or more and 500 or less) and the concentration thereof was changed to 1.8% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 $\mu\Omega\cdot cm$.

Example 10

In the same manner as in Example 9, except that the dispersant was changed to a polyoxyethylene tridecyl ether phosphoric acid ester (molecular weight: 200 or more and 500 or less), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 $\mu\Omega\cdot cm$.

Example 11

In the same manner as in Example 4, except that the dispersion vehicle was changed to triethylene glycol monomethyl ether (with proticity) and the concentration of the dispersant was changed to 1.8% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 8 $\mu\Omega\cdot cm$.

Example 12

In the same manner as in Example 11, except that the dispersion vehicle was changed to diethylene glycol monobutyl ether (with proticity) and the dispersant was changed to a mixture of "DISPERBYK (registered trademark)-111" with "DISPERBYK (registered trademark)-2001" at a mixing ratio of 1:2 and the concentration of the dispersant was changed to 3.6% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 6 μΩ·cm.

Example 13

In the same manner as in Example 7, except that the dispersion vehicle was changed to diethylene glycol monomethyl ether (with proticity) and the concentration of the dispersant was changed to 1.8% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 μΩ·cm.

Example 14

In the same manner as in Example 12, except that the dispersion vehicle was changed to diethylene glycol monomethyl ether (with proticity), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 μΩ·cm.

Example 15

In the same manner as in Example 11, except that the dispersion vehicle was changed to propylene glycol monobutyl ether (with proticity), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 μΩ·cm.

Example 16

In the same manner as in Example 15, except that the dispersion vehicle was changed to ethylene glycol monohexyl ether (with proticity), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 5 μΩ·cm.

Example 17

In the same manner as in Example 16, except that the dispersion vehicle was changed to 2-methylpentane-2,4-diol (with proticity), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 5 μΩ·cm.

Example 18

In the same manner as in Example 17, except that the dispersion vehicle was changed to ethylene glycol mono-tert-butyl ether (with proticity), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 9 μΩ·cm.

Example 19

In the same manner as in Example 18, except that the dispersion vehicle was changed to ethylene glycol (with proticity), a copper particulate dispersion was prepared. The copper particulates were dispersed. This copper particulate dispersion was stored at 5° C. for one month. As a result, no change occurred.

Example 20

In the same manner as in Example 19, except that the dispersion vehicle was changed to propylene glycol (with proticity), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 6 μΩ·cm.

Example 21

In the same manner as in Example 20, except that the dispersion vehicle was changed to propylene carbonate (with aprotic polarity, dielectric constant: 64), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 μΩ·cm.

Example 22

In the same manner as in Example 21, except that the dispersion vehicle was changed to 1,5-pentanediol (with proticity), a copper particulate dispersion was prepared. The copper particulates were dispersed. This copper particulate dispersion was stored at 5° C. for one month. As a result, no change occurred.

Example 23

In the same manner as in Example 22, except that the dispersion vehicle was changed to 2-octanol (with proticity), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 8 μΩ·cm.

Example 24

In the same manner as in Example 23, except that the dispersion vehicle was changed to a mixture of 3-methoxy-3-methyl butanol with 2-methylpentane-2,4-diol at a mixing ratio of 1:1 (with proticity), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 6 µΩ·cm.

Example 25

In the same manner as in Example 24, except that the dispersion vehicle was changed to 1,3-dimethyl-2-imidazolidinone (with aprotic polarity, dielectric constant: 38) and the dispersant was changed to a compound having a carboxyl group, which has a molecular weight of 200 or more and 2,000 or less (manufactured by BYK-Chemie under the trade name of "BYK (registered trademark)-P105"), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 5 µΩ·cm.

Example 26

In the same manner as in Example 24, except that the dispersion vehicle was changed to N,N-dimethylacetamide (with aprotic polarity, dielectric constant: 38), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 µΩ·cm.

Example 27

In the same manner as in Example 26, except that the dispersion vehicle was changed to N,N-dimethylformamide (with aprotic polarity, dielectric constant: 37), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 4 µΩ·cm.

Example 28

In the same manner as in Example 27, except that the dispersion vehicle was changed to N-methyl pyrrolidone (with aprotic polarity, dielectric constant: 32), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 5 µΩ·cm.

Example 29

In the same manner as in Example 28, except that the dispersion vehicle was changed to γ-butyrolactone (with aprotic polarity, dielectric constant: 39), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 6 µΩ·cm.

Example 30

In the same manner as in Example 7, except that the dispersion vehicle was changed to γ-butyrolactone (with aprotic polarity, dielectric constant: 39) and the concentration of the dispersant was changed to 3.6% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 µΩ·cm.

Example 31

In the same manner as in Example 29, except that the dispersion vehicle was changed to 1,3-dimethyl-2-imidazolidinone (with aprotic polarity, dielectric constant: 38), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 5 µΩ·cm.

Example 32

In the same manner as in Example 31, except that the dispersant was changed to a mixture of "DISPERBYK (registered trademark)-111" with "DISPERBYK (registered trademark)-2001" at a mixing ratio of 1:2 and the concentration thereof was changed to 3.6% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 5 µΩ·cm.

Example 33

In the same manner as in Example 32, except that the dispersant was changed to a phosphoric acid salt having a phosphoric acid group, which has a molecular weight of 1,000 or more and less than 10,000 (manufactured by BYK-Chemie under the trade name of "DISPERBYK (registered trademark)-145"), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 4 µΩ·cm.

Example 34

In the same manner as in Example 33, except that the dispersant was changed to a low molecular polyaminoamide and an acid polymer salt (manufactured by BYK-Chemie under the trade name of "ANTI-TERRA (registered trademark)-U100"), a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 2 µΩ·cm.

Example 35

In the same manner as in Example 30, except that the dispersion vehicle was changed to propylene carbonate (with aprotic polarity, dielectric constant: 64) and the concentration of the dispersant was changed to 1.8% by weight, a copper particulate dispersion was prepared. The copper particulates were dispersed. This copper particulate dispersion was stored at 5° C. for one month. As a result, no change occurred. A conductive film formed by photo sintering using this copper particulate dispersion had a resistivity of 7 μΩ·cm.

Comparative Example 1

In the same manner as in Example 31, except that the dispersion vehicle was changed to propylene glycol methyl ether acetate (with nonpolarity), a copper particulate dispersion was prepared. The copper particulates were dispersed. This copper particulate dispersion was stored at 5° C. for one month. As a result, a precipitate was formed and thus it was found to have non-high dispersion stability.

Comparative Example 2

In the same manner as in Comparative Example 1, except that dispersion vehicle was changed to a mixture of butoxyethyl acetate with propylene glycol methyl ether acetate at a mixing ratio of 5:1 (with nonpolarity), a copper particulate dispersion was prepared. The copper particulates were dispersed. This copper particulate dispersion was stored at 5° C. for one month. As a result, a precipitate was formed.

Comparative Example 3

In the same manner as in Comparative Example 2, except that the dispersion vehicle was changed to diethylene glycol methyl ethyl ether (with nonpolarity), a copper particulate dispersion was prepared. The copper particulates were dispersed. This copper particulate dispersion was stored at 5° C. for one month. As a result, a precipitate was formed.

Comparative Example 4

In the same manner as in Comparative Example 3, except that the dispersion vehicle was changed to tetraethylene glycol dimethyl ether (with nonpolarity), an attempt was made to prepare a copper particulate dispersion. However, copper particulates were not dispersed.

Comparative Example 5

In the same manner as in Comparative Example 3, except that the dispersion vehicle was changed to ethylene glycol monophenyl ether (with proticity, which is not within a technical scope of the present invention because of containing a phenyl group), an attempt was made to prepare a copper particulate dispersion. However, copper particulates were not dispersed.

Comparative Example 6

In the same manner as in Comparative Example 3, except that the dispersion vehicle was changed to diethylene glycol butyl methyl ether (with nonpolarity), a copper particulate dispersion was prepared. The copper particulates were dispersed. This copper particulate dispersion was stored at 5° C. for one month. As a result, a precipitate was formed.

Comparative Example 7

In the same manner as in Comparative Example 6, except that the dispersion vehicle was changed to triethylene glycol butyl methyl ether (with nonpolarity), a copper particulate dispersion was prepared. The copper particulates were dispersed. This copper particulate dispersion was stored at 5° C. for one month. As a result, a precipitate was formed.

Comparative Example 8

In the same manner as in Comparative Example 7, except that the dispersion vehicle was changed to diethylene glycol dibutyl ether (with nonpolarity), an attempt was made to prepare a copper particulate dispersion. However, copper particulates were not dispersed.

Comparative Example 9

In the same manner as in Comparative Example 7, except that the dispersion vehicle was changed to diethylene glycol diethyl ether (with nonpolarity), a copper particulate dispersion was prepared. The copper particulates were dispersed. This copper particulate dispersion was stored at 5° C. for one month. As a result, a precipitate was formed.

Comparative Example 10

In the same manner as in Comparative Example 9, except that the dispersion vehicle was changed to ethyl acetate (with nonpolarity), an attempt was made to prepare a copper particulate dispersion. However, copper particulates were not dispersed.

Comparative Example 11

In the same manner as in Comparative Example 9, except that the dispersion vehicle was changed to hexane (with nonpolarity), an attempt was made to prepare a copper particulate dispersion. However, copper particulates were not dispersed.

Comparative Example 12

In the same manner as in Comparative Example 9, except that the dispersion vehicle was changed to toluene (with nonpolarity), an attempt was made to prepare a copper particulate dispersion. However, copper particulates were not dispersed.

Comparative Example 13

In the same manner as in Comparative Example 9, except that the dispersant was changed to acetone (with aproticity, dielectric constant: 21), an attempt was made to prepare a copper particulate dispersion. However, copper particulates were not dispersed.

Comparative Example 14

In the same manner as in Comparative Example 9, except that the dispersion vehicle was changed to water, ethanol, 2-propanol and 1-butanol (one hydroxyl group, 4 or less carbon atoms), copper particulate dispersions were prepared. In each case, the copper particulates were dispersed. These copper particulate dispersions were stored at 5° C. for one month. As a result, elution (corrosion) of copper particulates into a dispersion vehicle occurred, and thus discoloration of the liquid occurred and a precipitation was formed in each case.

Comparative Example 15

Using copper particulates having a center particle diameter of 400 nm, 3-methoxy-3-methyl butanol (protic polarity) as a dispersion vehicle, and a compound having a phosphoric acid group, which has a molecular weight of about 1,500 (manufactured by BYK-Chemie under the trade name of "DISPERBYK (registered trademark)-111") as a dispersant, a copper particulate dispersion was prepared. The concentration of the dispersant was adjusted to 3.6% by weight and the concentration of copper particulates was adjusted to 40% by weight. The concentration of the dispersion vehicle is balance thereof. Copper particulates were not dispersed.

As is apparent from the above-mentioned Examples and Comparative Examples, it is preferred that a dispersant having an acidic functional group is used and a polar dispersion vehicle is used as a dispersion vehicle so as to disperse copper particulates. It was found that it is preferred that the polar dispersion vehicle contains at least one of a protic dispersion vehicle and an aprotic polar dispersion vehicle having a dielectric constant of 30 or more so as to enhance dispersion stability of a copper particulate dispersion.

The present invention is not limited to the constitutions of the above-mentioned embodiments, and various modifications can be made without departing from the scope of the present invention.

The invention claimed is:

1. A copper particulate dispersion comprising copper particulates, at least one kind of a dispersion vehicle containing the copper particulates, and at least one kind of dispersant which allows the copper particulates to disperse in the dispersion vehicle, wherein
    the copper particulates have a center particle diameter of 1 nm or more and less than 100 nm, concentration of the copper particulates is 1% by weight or more and 80% by weight or less based on the copper particulate dispersion,
    the dispersion vehicle is a polar dispersion vehicle which contains at least one of a protic dispersion vehicle and an aprotic polar dispersion vehicle having a dielectric constant of 30 or more,
    the protic dispersion vehicle is a linear or branched alkyl compound or alkenyl compound of 5 or more and 30 or less carbon atoms, which has one hydroxyl group, or a linear or branched alkyl compound or alkenyl compound of 2 or more and 30 or less carbon atoms, which has 2 or more and 6 or less hydroxyl groups,
    the aprotic polar dispersion vehicle is selected from the group consisting of propylene carbonate, 1,3-dimethyl-2-imidazolidinone, N,N-dimethylacetamide, N,N-dimethylformamide, N-methyl pyrrolidone and γ-butyrolactone,
    the dispersant is a compound having at least one acidic functional group, which has a molecular weight of 200 or more and 100,000 or less, or a salt thereof, concentration of the dispersant is 0.5% by weight or more and 50% by weight or less based on the copper particulate dispersion, and
    the acidic functional group of the dispersant is selected from the group consisting of a phosphoric acid group, a phosphonic acid group, a sulfonic acid group and a sulfuric acid group.

2. The copper particulate dispersion according to claim 1, wherein the protic dispersion vehicle has 1 or more and 10 or less ether bonds.

3. The copper particulate dispersion according to claim 1, wherein the protic dispersion vehicle has 1 or more and 5 or less carbonyl groups.

4. A conductive film forming method comprising the steps of:
    forming a film made of the copper particulate dispersion according to claim 1 on a surface of an object,
    drying the film thus formed, and
    forming a conductive film through photo sintering of irradiating the dried film with light.

5. A circuit board comprising a circuit including the conductive film formed by the conductive film forming method according to claim 4 on a substrate.

6. A copper particulate dispersion comprising copper particulates, at least one kind of a dispersion vehicle containing the copper particulates, and at least one kind of dispersant which allows the copper particulates to disperse in the dispersion vehicle, wherein
    the copper particulates have a center particle diameter of 1 nm or more and less than 100 nm, concentration of the copper particulates is 1% by weight or more and 80% by weight or less based on the copper particulate dispersion,
    the dispersion vehicle is a protic dispersion vehicle,
    the protic dispersion vehicle is selected from the group consisting of 3-methoxy-3-methyl butanol, triethylene glycol monomethyl ether, propylene glycol monobutyl ether, ethylene glycol monohexyl ether, ethylene glycol mono-tert-butyl ether, and 2-octanol,
    the dispersant is a compound having at least one carboxyl group, which has a molecular weight of 200 or more and 100,000 or less, or a salt thereof, concentration of the dispersant is 0.5% by weight or more and 50% by weight or less based on the copper particulate dispersion.

7. A conductive film forming method comprising the steps of:
    forming a film made of the copper particulate dispersion according to claim 6 on a surface of an object,
    drying the film thus formed, and
    forming a conductive film through photo sintering of irradiating the dried film with light.

8. A circuit board comprising a circuit including the conductive film formed by the conductive film forming method according to claim 7 on a substrate.

* * * * *